United States Patent [19]
Igarashi

[11] Patent Number: 6,057,728
[45] Date of Patent: May 2, 2000

[54] SEMICONDUCTOR CIRCUIT AND POWER TRANSISTOR PROTECTION CIRCUIT

[75] Inventor: Takashi Igarashi, Tokyo, Japan

[73] Assignee: Mitsubishi Denki Kabushiki Kaisha, Tokyo, Japan

[21] Appl. No.: 09/055,912

[22] Filed: Apr. 7, 1998

[30] Foreign Application Priority Data

Oct. 2, 1997 [JP] Japan ..................................... 9-269846

[51] Int. Cl.[7] ................................. G05F 1/10; G05F 3/02
[52] U.S. Cl. ............................................. 327/546; 327/427
[58] Field of Search ..................................... 327/427, 430, 327/431, 434, 437, 440, 374, 545, 546, 581, 379, 389, 433, 478; 361/18, 90, 91

[56] References Cited

U.S. PATENT DOCUMENTS

| | | | |
|---|---|---|---|
| 4,890,009 | 12/1989 | Miyazaki et al. | 307/270 |
| 5,510,943 | 4/1996 | Fukunaga | 361/18 |
| 5,664,550 | 9/1997 | Ito et al. | 123/630 |
| 5,789,971 | 8/1998 | Colletti et al. | 327/541 |
| 5,852,538 | 12/1998 | Masui | 361/18 |
| 5,910,746 | 6/1999 | Fordyce | 327/379 |

*Primary Examiner*—My-Trang Nu Ton
*Attorney, Agent, or Firm*—Oblon, Spivak, McClelland, Maier & Neustadt, P.C.

[57] ABSTRACT

A decision circuit (10) monitors a main current flowing in an IGBT (1), and when operation of the IGBT (1) enters an overcurrent state and the control voltage applied to the control terminal (G) of the IGBT (1) is equal to or larger than the threshold voltage, it determines that the IGBT (1) is in the overcurrent state and places the IGBT (1) in an OFF state, and also outputs the result of the determination as an output signal to an external microcomputer from an error output terminal (9). Receiving this output signal, the microcomputer immediately fixes driving signals for the IGBT (1) and another IGBTs at an OFF signal level to disconnect these IGBTs, thus preventing the main current of the IGBT (1) from increasing to a still larger overcurrent to protect the IGBT (1). Generation of a turn-off surge voltage is suppressed in the overcurrent state by detecting the overcurrent state of the power transistor by earlier timing.

7 Claims, 10 Drawing Sheets

FIG. 7A INPUT TERMINAL VOLTAGE
FIG. 7B GATE VOLTAGE
FIG. 7C IGBT COLLECTOR CURRENT
FIG. 7D GATE VOLTAGE DETECTING CIRCUIT OUTPUT
FIG. 7E OVERCURRENT DETECTING CIRCUIT OUTPUT
FIG. 7F OVERCURRENT DECISION CIRCUIT OUTPUT
FIG. 7G ERROR OUTPUT TERMINAL VOLTAGE
FIG. 7H TIME

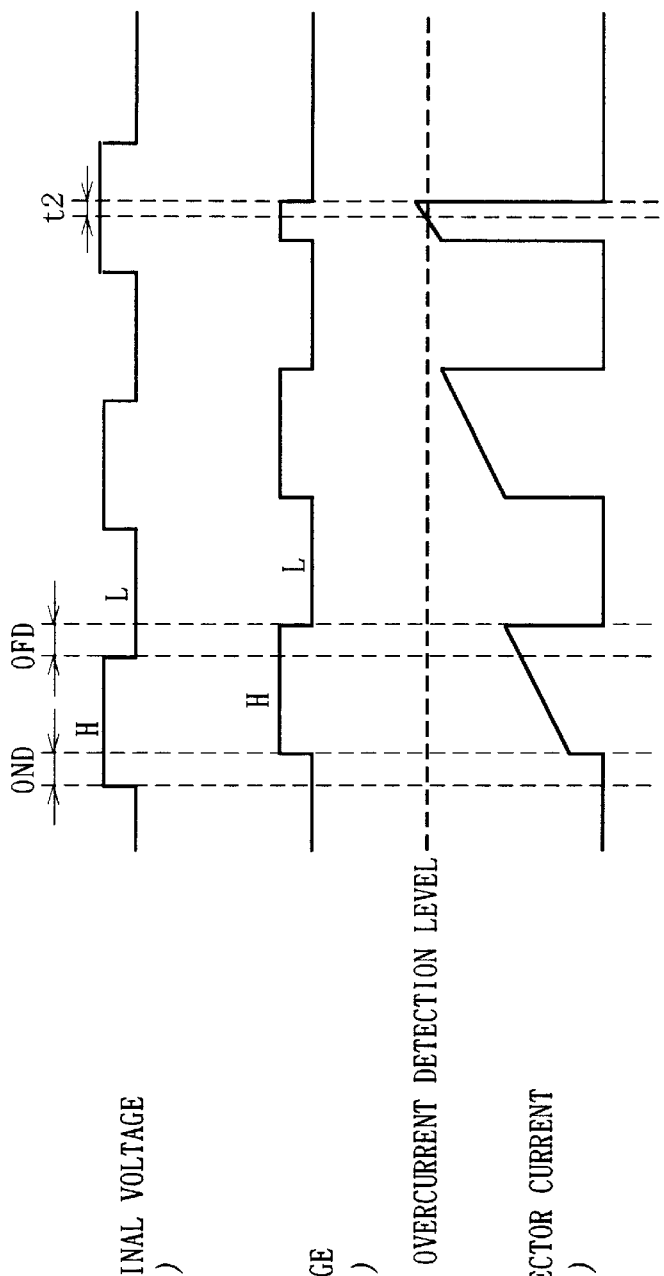
FIG.12A INPUT TERMINAL VOLTAGE (BACKGROUND ART)
FIG.12B GATE VOLTAGE (BACKGROUND ART)
FIG.12C IGBT COLLECTOR CURRENT (BACKGROUND ART)
FIG.12D OVERCURRENT DETECTING CIRCUIT OUTPUT (BACKGROUND ART)
FIG.12E OVERCURRENT DECISION CIRCUIT OUTPUT (BACKGROUND ART)
FIG.12F ERROR OUTPUT TERMINAL VOLTAGE (BACKGROUND ART)

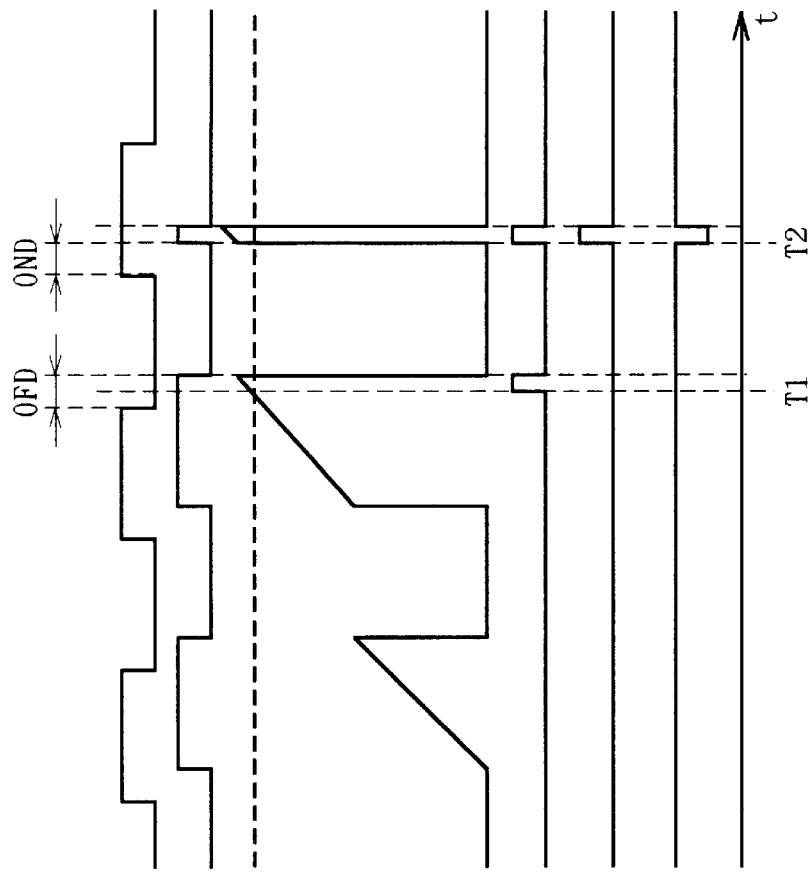
FIG. 13A INPUT TERMINAL VOLTAGE
FIG. 13B GATE VOLTAGE
FIG. 13C IGBT COLLECTOR CURRENT
FIG. 13D OVERCURRENT DETECTING CIRCUIT OUTPUT
FIG. 13E OVERCURRENT DECISION CIRCUIT OUTPUT
FIG. 13F ERROR OUTPUT TERMINAL VOLTAGE
FIG. 13G TIME

SEMICONDUCTOR CIRCUIT AND POWER TRANSISTOR PROTECTION CIRCUIT

BACKGROUND OF THE INVENTION

1. Field of the Invention

The present invention relates to a circuit for detecting overcurrent state of main current flowing in a power transistor, and further to a semiconductor circuit for protecting the power transistor itself from the overcurrent on the basis of the detection of overcurrent state and also controlling driving of another power transistors. The technology of the present invention is applicable to an inverter circuit for a motor, for example.

2. Description of the Background Art (Background Art 1)

A conventional overcurrent protection circuit for an IGBT, one of the power transistors, will now be described referring to FIG. 11, and FIG. 2A to FIG. 12F.

FIG. 11 is a block diagram showing an IGBT driving circuit device including a conventional IGBT overcurrent protection circuit. Note that the circuit shown in FIG. 11 relates to technical know-how or inside technology of the applicant of the present invention, which is publicly not known.

In FIG. 11, the character 1P denotes an IGBT as a power transistor (whose collector is connected to an inductance and a free-wheel diode not shown), 2P denotes a current detecting circuit, 3P denotes an overcurrent detecting circuit (a comparison circuit), 4P denotes an overcurrent decision circuit (an AND circuit), 5P denotes an error output terminal, 6P denotes an input terminal, 7P denotes an IGBT driving circuit, and 8P denotes a gate resistance.

This circuit is characterized in the following points: (1) one input end of the overcurrent decision circuit 4P is connected to the input signal line 15P which is connected to the input terminal 6P at the node N1P; and (2) the output signal line 13P which branches from the output node N2P of the circuit 4P is connected to one input end of the NOR circuit in the IGBT driving circuit 7P.

Now, if a signal at an "H" level is inputted to the input terminal 6P, the IGBT driving circuit 7P outputs a signal at an "H" level, which causes the gate of the IGBT 1P to go to an "H" level through the gate resistance 8P to turn on the IGBT 1P. If a signal at an "L" level is inputted to the input terminal 6P in this condition, the IGBT driving circuit 7P outputs a signal at an "L" level, which places the gate of the IGBT 1P on an "L" level through the gate resistance 8P to turn off the IGBT 1P. This change in state is shown in the timing chart in FIG. 12A to FIG. 12F.

As shown in FIG. 12A to FIG. 12F, there occurs an ON delay time OND between when the input signal at the "H" level corresponding to an ON signal level is applied to the input terminal 6P and when the IGBT 1P changes from the OFF state to the ON state. Similarly, there occurs an OFF delay time OFD between when the input signal at the "L" level corresponding to an OFF signal level is applied to the input terminal 6P and when the IGBT 1P changes from the ON state to the OFF state. These delay times OND and OFD occur due to the IGBT driving circuit 7P.

When the "H" level input signal is applied to the input terminal 6P, the IGBT 1 turns on after an elapse of the ON delay time OND, and the current flowing in the IGBT 1P at this time is monitored by the current detecting circuit 2P. If the overcurrent detecting circuit 3P detects that the current flowing in the IGBT 1P has reached an overcurrent state, the overcurrent decision circuit 4P outputs a signal at an "H" level only when the input signal is the ON signal at that time, so as to control the output of the IGBT driving circuit 7P to the "L" level, thereby disconnecting the gate of the IGBT 1P to bring the IGBT 1P in the OFF state. At the same time, the circuit 4P externally signals that the IGBT 1P is in the overcurrent state from the error output terminal 5P. FIG. 12 to FIG. 12F show the error output state as an overcurrent state which takes place and is detected when the third ON signal is inputted.

Since the structure of the current detecting circuit 2P uses resistance herein, the overcurrent detecting circuit 3P detects the overcurrent state when the voltage across both ends of the resistance becomes larger than a threshold voltage set in the overcurrent detecting circuit 3P. The value of the resistance is set to generate as small voltage as possible, since large voltage generated at the resistance causes large power loss. However, if noise gets on the resistance in the current detecting circuit 2P when the IGBT 1P is in the OFF state, and if the noise is equal to or larger than the voltage set in the overcurrent detecting circuit 3P, the overcurrent detecting circuit 3P will detect the noise as overcurrent. To prevent this problem, such erroneous determination of detecting an overcurrent state due to a noise when the operation of the IGBT is OFF can be prevented if it is structured to detect the overcurrent only when an input signal at the ON signal level is inputted to the input terminal. Accordingly, in the circuit shown in FIG. 11, the node N1P and one input end of the circuit 4P are connected through the signal line 15P, so that the overcurrent decision circuit 4P determines that the IGBT 1P is in an overcurrent state when the overcurrent detector 3P detects an overcurrent (the "H" level output) with the ON signal level ("H" level) input signal applied to the input terminal 6P.

(Second Background Art; Prior References)

Overcurrent protection circuits for power transistors disclosed in preceding references include those shown in (1) Japanese Patent Laying-Open No. 7-183781, (2) Japanese Patent Laying-Open No. 6-276073, and (3) Japanese Patent Laying-Open No. 6-105448.

In the reference (1), a current detecting resistance detects current flowing in the IGBT as a voltage value. When an overcurrent state is detected, a control thyristor is turned on with that voltage to generate a turning-off instruction to the IGBT.

In the reference (2), it is detected whether current flowing in the IGBT is placed in an overcurrent state due to a short-circuit trouble on the basis of the current flowing in the IGBT and part of input signal to an IGBT driving circuit. This function is equivalent to that of the above-described circuit shown in FIG. 11. However, the reference (2) aims principally at protecting the IGBT from overcurrent flowing due to an accident when the IGBT is in the ON state.

In the reference (3), the overcurrent state is detected only by detecting the current flowing in the IGBT, on the basis of which the driving voltage for the IGBT is controlled. The reference (3), too, focuses on detection of overcurrent caused by a short-circuit trouble in the ON state.

The overcurrent protection circuit shown in FIG. 11 raises a new problem caused by the presence of the signal line 15P. This will be described below referring to FIG. 11 and the timing chart shown in FIG. 13A to FIG. 13G.

Now, suppose that the input signal changed from the "H" level corresponding to the ON signal level to the "L" level corresponding to the OFF signal level, and then the current flowing in the IGBT 1P reached the overcurrent state before an elapse of the OFF delay time OFD required for the IGBT 1P to change from the ON state to the OFF state (at time T1). In this case, the current detecting circuit 2P outputs a voltage indicating that an overcurrent is flowing in the IGBT 1P to the input end of the overcurrent detecting circuit 3P, which causes the circuit 3P to output an output signal at the "H" level. However, since the input signal is at the "L" level corresponding to the OFF signal level at this time, the overcurrent decision circuit 4P does not recognize the current flowing in the IGBT 1P to be overcurrent, and it therefore cannot signal a decision indicating the overcurrent state of the IGBT 1P, or an error output, to the outside. As a result, the supply of the input signal is kept uninterrupted after time T1. When the input signal changes to the ON signal level again, the overcurrent decision circuit 4P cannot signal the occurrence of the overcurrent state to the outside until the IGBT 1P turns on and the overcurrent flows again, that is to say, until time T2. The input signal supplied from outside is then fixed at the OFF signal level after that. The IGBT 1P is thus turned off at time T2 at which the main current is presenting a still larger current value, which inevitably causes a large surge voltage. Furthermore, another IGBTs standing in the ON state, not shown, are turned off at that timing, too.

This problem also occurs in the above-mentioned prior references (1) to (3), but the references (1) to (3) do not suggest this problem. Moreover, in the reference (1), the problem that an overcurrent state is erroneously detected due to a noise and is externally outputted when the IGBT is OFF is left unsolved. Accordingly, the references (1) to (3) do not provide means for solving this problem.

As have been described with the example shown in FIG. 11, FIG. 12A to FIG. 12F, FIG. 13A to FIG. 13G, the conventional overcurrent protection circuit externally signals that the power transistor is in an overcurrent state from the error output terminal when the overcurrent detector (resistance) detects an overcurrent state with the input signal presenting an ON signal. Therefore, if the overcurrent state occurs before the power transistor makes a transition from ON operation to OFF operation, the overcurrent state cannot be detected at the moment of its occurrence. It is when the ON delay time has passed after the next input of the input signal at the ON signal level, that is, when the power transistor has reached the overcurrent state again, that the overcurrent state is detected and the result is signaled to the outside. The current value flowing in the power transistor increases in this delay in the detecting timing, which causes the problem that the power transistor is controlled to the turned-off state in the condition or timing where the value of the main current has grown to a still larger current value over the overcurrent detection level (a reference level).

This problem may occur not only when the load includes only an inductance component of a load device such as a motor but also when the load includes resistance. It can be said that this problem generally occurs when an overcurrent takes place in a switching circuit using a power transistor.

SUMMARY OF THE INVENTION

According to a first aspect of the present invention, a semiconductor circuit comprises: a power transistor comprising a first main electrode connected to a load, a second main electrode and a control electrode, and the power transistor passing a main current between the first main electrode and the second main electrode when a control voltage applied to the control electrode is equal to or larger than a threshold voltage; an input signal line receiving and transmitting an input signal having an ON signal level and an OFF signal level which alternately and periodically vary; a driving circuit comprising an input end connected to the input signal line and an output end connected to the control electrode of the power transistor, the driving circuit outputting the control voltage equal to or larger than the threshold voltage from the output end after a delay corresponding to an ON delay time has passed after input of the input signal when the level of the input signal is at the ON signal level, and outputting the control voltage smaller than the threshold voltage from the output end after a delay corresponding to an OFF delay time has passed after input of the input signal when the level of the input signal is at the OFF signal level; and a decision circuit receiving the main current and the control voltage of the power transistor as its input signals, and the decision circuit deciding that the power transistor is in an overcurrent state when detecting that the control voltage is equal to or larger than the threshold voltage and the main current is equal to or larger than a certain threshold current.

Preferably, according to a second aspect, in the semiconductor circuit, the decision circuit executes a first comparison between the control voltage and the threshold voltage and a second comparison between the main current and the threshold current and decides whether the overcurrent state is occurring on the basis of the result of the first comparison and the result of the second comparison.

Preferably, according to a third aspect, the semiconductor circuit further comprises: an output signal line connected to an output end of the decision circuit, outputting an output signal presenting the result of the decision made by the decision circuit as an error detection signal.

Preferably, according to a fourth aspect, the semiconductor circuit further comprises: a control circuit connected to the input signal line and the output signal line, and the control circuit fixing the level of the input signal at the OFF signal level in response to input timing of the error detection signal when the error detection signal indicates that the power transistor is in the overcurrent state.

Preferably, according to a fifth aspect, the semiconductor circuit further comprises: another power transistor driving an external load device together with the power transistor, and another driving circuit comprising an input end connected to the control circuit to receive another input signal outputted from the control circuit and alternately varied between the ON signal level and the OFF signal level, to thereby driving the other power transistor, wherein when the error detection signal indicates that the power transistor is in the overcurrent state, the control circuit fixes the level of the other input signal at the OFF signal level in response to input timing of the error detection signal.

Preferably, according to a sixth aspect, in the semiconductor circuit, the driving circuit is connected also to the output end of the decision circuit, and the driving circuit changes the control voltage equal to or larger than the threshold voltage to the voltage smaller than the threshold voltage when the level of the input signal is at the ON signal level and the result of the decision made by the decision circuit shows detection of the overcurrent state.

A seventh aspect of the present invention relates to a circuit protecting a power transistor connected to a load from an overcurrent state, which detects that a main current flowing in the power transistor is in the overcurrent state on the basis of a first input signal indicating a control voltage to the power transistor and a second input signal indicating the main current flowing in the power transistor and outputs the result of the detection to the outside.

The first aspect of the present invention provides the following functions and effects.

When the input signal at the ON signal level is inputted, the power transistor goes in the ON operation state when the ON delay time has elapsed after the application of the input signal, and then the main current starts flowing through the load, and the main current increases. After that, when the level of the input signal varies from the ON signal level to the OFF signal level, the power transistor goes in the OFF operation state when the OFF delay time has elapsed after the variation, and then the main current does not flow any longer. Subsequently, when the input signal level changes to the ON signal level again, a main current having a still larger current value starts flowing after an elapse of the ON delay time. These states are alternately repeated.

Now, suppose that the level of the input signal has changed from the ON signal level to the OFF signal level and the current value of the main current has reached a value equal to or larger than the threshold current at a first timing before the OFF delay time passes. At this time, the decision circuit detects that the power transistor is in the overcurrent state at that timing because the control voltage outputted from the driving circuit is still equal to or larger than the threshold voltage and the main current is flowing. After that, at a second timing after an elapse of the OFF delay time, the control voltage becomes smaller than the threshold and the power transistor goes in the OFF state.

Thus, according to the present invention, when the level of the input signal supplied from outside changed from the ON signal level to the OFF signal level and then the main current reached the overcurrent level or higher before an elapse of the OFF delay time, it is possible to immediately and correctly detect this state at the time when the main current reached that level (the first timing above).

Further, according to the present invention, also when the increasing main current reaches the overcurrent level or higher when the input signal at the ON signal level is being inputted, the decision circuit can immediately and certainly detect the occurrence of the overcurrent state at that moment.

Particularly, according to the second aspect, since the decision circuit makes the decision through the first and second comparison processings, the decision circuit can be formed by using comparison circuits. The circuit can thus be formed of simple and practical circuits.

Further, according to the third aspect, when the increasing main current level reached the overcurrent level, it is possible to certainly output the occurrence of the overcurrent state of the power transistor as an error to the outside at the moment at which the main current level has reached the overcurrent level, not only when it took place in the ON state but also when it took place before an elapse of the OFF delay time. This allows the external part to execute various processings, such as of disconnecting the power transistor completely to the OFF state to protect the power transistor from the overcurrent in an earlier stage on the basis of the timing of output of the error detection signal.

According to the fourth aspect, the control circuit fixes the level of the input signal at the OFF signal level when receiving the error detection signal and therefore the power transistor is continuously fixed in the OFF state after that. Thus, it is possible to disconnect the power transistor in a forced manner in an earlier stage after output of the error detection signal, which prevents the conventional problem that the power transistor is disconnected in a forced manner in the next ON state after the occurrence of the overcurrent state in which a still larger main current is flowing. This further reduces the turn-off surge voltage of the power transistor, thus certainly protecting the power transistor from a large overcurrent.

Particularly, according to the fifth aspect, the control circuit fixes the level of another input signal at the OFF signal level as well as the level of the input signal in response to the timing of the main current reached the overcurrent level, so that another power transistor can be disconnected into the OFF state after that by the same timing. That is to say, it is also possible to fix operation of another power transistor in the OFF state in a forced manner by earlier timing after the moment at which the power transistor reached the overcurrent state, and hence, while a relatively small main current is flowing. This certainly prevents the problem in which another power transistor is disconnected by another timing in the ON state after the timing of the output of the error detection signal in which a still larger main current flows, which prevents occurrence of a large surge voltage also when another power transistor turns off.

Further, according to the sixth aspect, if the main current reaches the overcurrent level when the input signal is at the ON signal level, it is possible to control the power transistor standing in the ON state so that it goes in the OFF state in a forced manner, which protects the power transistor from the overcurrent in an earlier stage.

According to the seventh aspect, occurrence of the overcurrent state is detected by using not only the level of the main current but also the level of the control voltage. Accordingly, the occurrence of the overcurrent state can be correctly detected without erroneous determination whenever the overcurrent state occurs. Furthermore, since the result is externally outputted at the moment of detection, the external part can disconnect the power transistor by earlier timing in response to the output timing to avoid occurrence of a large surge voltage, thus protecting the power transistor from the overcurrent.

The present invention has been made to solve the problem described above.

A first object of the present invention is to enable reliable detection of the overcurrent state at the moment of its occurrence not only when the overcurrent state has occurred while the power transistor is in ON operation but also when it has occurred while the power transistor is making a transition from ON operation to OFF operation, and to continuously disconnect the power transistor itself near the moment of its occurrence so as to prevent generation of a large surge voltage and to protect the power transistor against overcurrent in an earlier stage.

A second object of the present invention is to signal the detected occurrence of the overcurrent state at the moment of the occurrence as an error to a driving control system for another power transistor.

A further object is to also disconnect another power transistor through the control system to suppress a surge voltage at another power transistor at the time of turn off.

These and other objects, features, aspects and advantages of the present invention will become more apparent from the following detailed description of the present invention when taken in conjunction with the accompanying drawings.

BRIEF DESCRIPTION OF THE DRAWINGS

FIG. 12A–FIG. 12F show a timing chart of overcurrent protection in the use of the conventional power transistor overcurrent protection circuit.

FIG. 13A–FIG. 13G show a timing chart showing a problem in the use of the conventional power transistor overcurrent protection circuit.

DESCRIPTION OF THE PREFERRED EMBODIMENTS

To solve the problem described above, semiconductor circuits according to the preferred embodiments determine that a power transistor is in an overcurrent state when (1) the control voltage applied to the control electrode of the power transistor is equal to or larger than the threshold voltage of the power transistor and (2) an overcurrent detector detects an overcurrent state, and then disconnect that power transistor and other power transistors in response to the timing of detection. This enables protection of the power transistors from the overcurrent in an earlier stage after the occurrence of the overcurrent state and suppresses generation of a large turn-off surge voltage. Such characteristics of the semiconductor circuits will now be specifically described referring to the accompanying drawings.

(First Preferred Embodiment)

Figure 1:
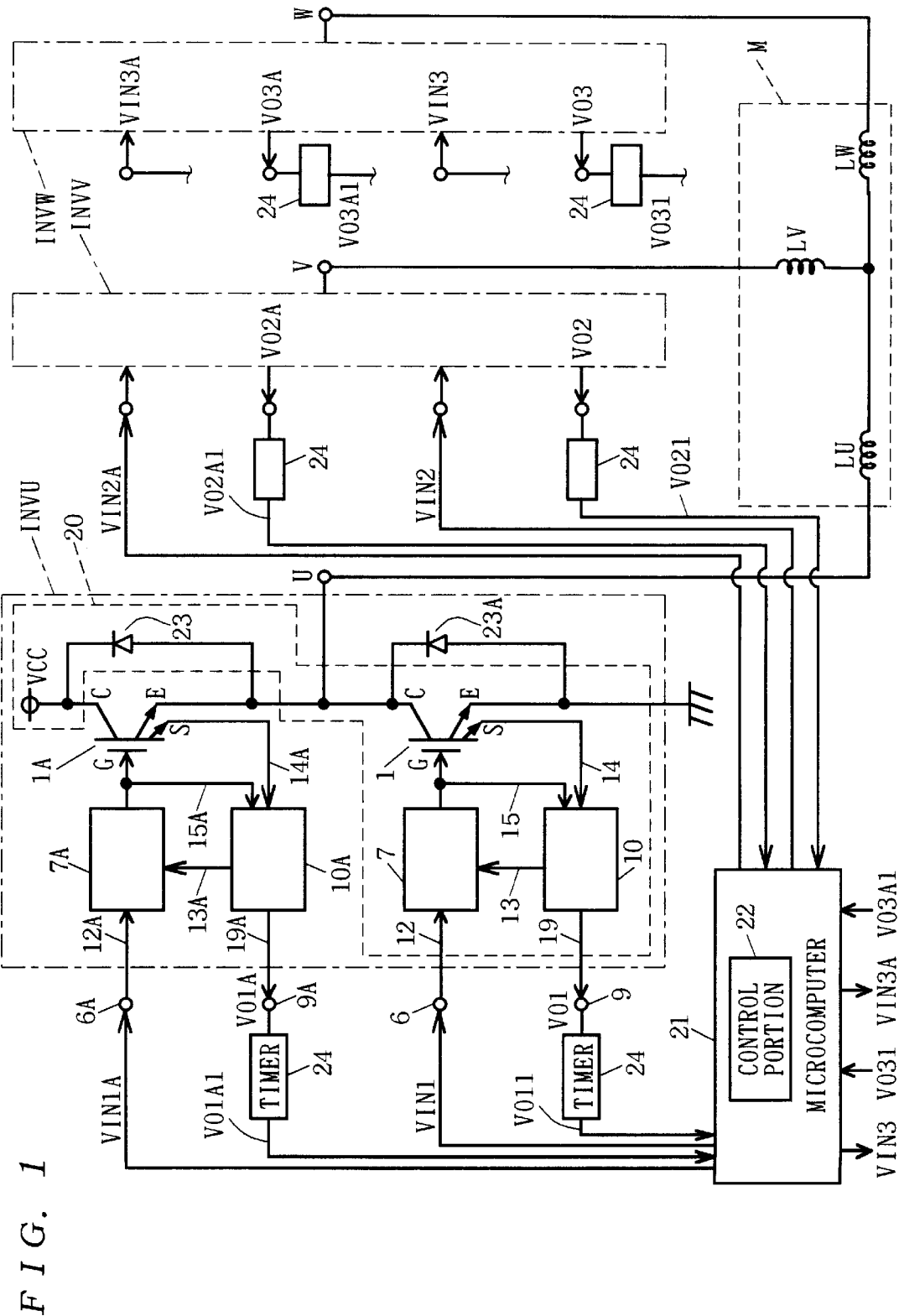
FIG. 1 is a block diagram showing a system configuration according to a first preferred embodiment for a semiconductor circuit of the present invention.

FIG. 1 is a block diagram showing a semiconductor circuit according to the present invention in the case where it is used as an inverter circuit for driving a three-phase AC motor M (corresponding to a load device).

As shown in FIG. 1, this semiconductor circuit is roughly divided into a first inverter circuit portion INVU, a second inverter circuit portion INVV, a third inverter circuit portion INVW and a microcomputer 21. The inverter circuit portions INVU to INVW respectively have output terminals U, V, W respectively connected to coils or inductance components LU, LV, LW in the three-phase AC motor M. The circuit portions INVU to INVW have the same circuit configuration. Hence, for convenience, FIG. 1 shows the internal configuration only of the first inverter circuit portion INVU.

The internal configuration of each of the inverter circuit portions INVU to INVW is roughly divided into two overcurrent protection circuits corresponding to a power transistor 1A as the high-potential-side switching element and a power transistor 1 as the low-potential-side switching element, where the power transistor 1A and the power transistor 1 are connected to each other at the corresponding output terminal U (V, W). The power transistors are all IGBTs herein, and specifically, those shown in the example in FIG. 1 are each equipped with a sense terminal S. The two protection circuits differ from each other in that while the collector terminal C of the IGBT 1 is connected to the inductance component (L) on the motor M side and to a free-wheel diode 23 through the output terminal U, the emitter terminal E of the other IGBT 1A is connected to the inductance component (L') on the motor M side and to a free-wheel diode 23A through the output terminal U. The two protection circuits are configured in the same way in other respects. Accordingly, described hereinafter referring to FIG. 2 and others are configuration and operation of the protection circuit 20 for protecting the IGBT 1 from overcurrent. Elements in the protection circuit for the IGBT 1A are indicated by the same characters as the corresponding elements in the circuit 20 with "A's" appended on the right side.

The protection circuit 20 (20A) has an input terminal 6 (6A) and an error output terminal 9 (9A), which receives an input signal VIN1 (VIN1A) outputted from the microcomputer 22, mainly from its control portion 22 (formed of a CPU etc.) at its input terminal 6 (6A). The protection circuit 20 outputs an error detection signal VO1 (VO1A), a pulse signal, from its error output terminal 9 (9A). The detection signal VO1 (VO1A) is once inputted to a timer 24, and the timer 24 adjusts the duration time of pulse of the signal VO1 (VO1A) to an appropriate value and then outputs it to the control portion 22 as an error detection signal VO11 (VO1A1).

Receiving the error detection signal VO11 (VO1A1) as an input, the control portion 22 immediately outputs input signals VIN1 to VIN3A fixed at the OFF signal level ("L") to the IGBT driving circuits 7 (7A) in the inverter circuit portions which are driving the IGBTs (1, 1A, ...) so as to disconnect the gates of the IGBT 1 and the other IGBTs and fix all the IGBTs in the OFF state thereafter.

The load values of the respective IGBTs in the individual protection circuits depend on driving control of all IGBTs, which are individually determined on the basis of the inductance components LU, LV, and LW. When the IGBT 1 (1A) goes into the OFF state, the main current continuously flows in the closed loop formed of the IGBT 1 (1A) and the corresponding free-wheel diode 23 (23A) until the IGBT 1 (1A) attains the ON state again because of the presence of the load of the IGBT 1 (1A) and the free-wheel diode 23 (23A) connected in parallel to it. Accordingly, when each IGBT 1 (1A) turns on again, the main current increases, ideally, starting from the level of the value of the current flowing in the closed loop in the OFF state (actually the level somewhat drops; refer to FIG. 7C). Hence, the main current flowing in each IGBT 1 (1A) increases every time the input signal repeats on and off, whose level will eventually exceed the overcurrent detection level.

Accordingly, it is necessary, for protection of the IGBT 1 placed in the overcurrent state and for reduction of the surge voltage at the IGBT 1 (1A) at the time of turn off, to detect this state at timing as close to the occurrence as possible (ideally at the same time) and immediately signal the information to the microcomputer 21 to disconnect the IGBTs at timing it as early as possible. The protection circuit 20 shown in FIG. 1 realizes this requirement as described below.

Figure 2:
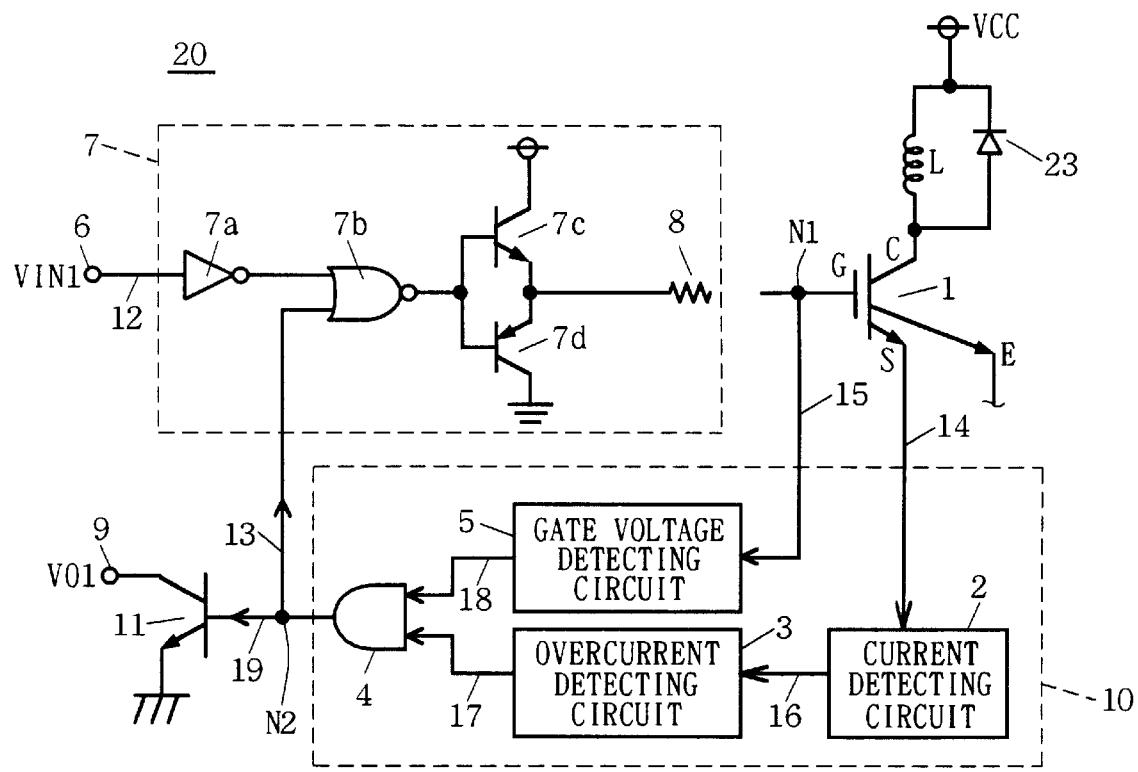
FIG. 2 is a diagram showing part of the circuit shown in FIG. 1 which corresponds to an overcurrent protection circuit for a power transistor.

In FIG. 2, the main reference characters denote the following elements. That is to say, 1 denotes an IGBT as a power transistor, 2 denotes a current detecting circuit, 3 denotes an overcurrent detecting circuit, 4 denotes an overcurrent decision circuit, 5 denotes a gate voltage detecting circuit for detecting a voltage applied to the gate G defining the control electrode of the IGBT 1, 6 denotes an input terminal, 7 denotes an IGBT driving circuit, 8 denotes a gate resistance, 9 denotes an error output terminal, 10 denotes a decision circuit, 12 denotes an input signal line, and 19 denotes an output signal line.

In more detail, the overcurrent protection circuit 20 for the power transistor shown in FIG. 2 is structured as follows.

First, the collector terminal C of the IGBT 1 as a power transistor is connected to one end of the load, i.e., inductance L, connected in parallel to the free-wheel diode 23 shown in FIG. 1. The other end of the inductance L is connected to a DC voltage-supply having the power-supply voltage VCC. This inductance L is a load determined on the basis of the excitation state of each coil of the three-phase motor M shown in FIG. 1 (which depends on the ON/OFF state of each power transistor in the above-described first to third inverter circuit portions INVU to INVW), and hence on the basis of the inductance components LU, LV, LW. The emitter terminal E of the IGBT 1 is grounded as shown in FIG. 1. The gate G of the IGBT 1 is connected to the output terminal N1 of the IGBT driving circuit 7. ON/OFF operation of the IGBT 1 is controlled on the basis of the level of the control voltage applied to the gate G. That is to say, when the control voltage is equal to or larger than the threshold voltage of the IGBT 1, operation of the IGBT 1 goes in the ON state and the main current flows between its collector C and emitter E. Since the IGBT 1 has a sense terminal S herein, the level of the main current can be detected through the sense terminal S.

In the circuit 20 shown in FIG. 1, the collector terminal or collector electrode C of the IGBT 1 corresponds to "a first main electrode," the gate G corresponds to "a control electrode," and the emitter terminal or emitter electrode E corresponds to "a second main electrode."

The IGBT driving circuit 7 is configured as follows. That is to say, the input signal line 12 has its one end connected to the input terminal 6 and its other end connected to the input end of an inverter 7a forming the input terminal of the circuit 7. The input signal VIN1 (FIG. 1) whose level periodically and alternately varies between the ON signal level ("H" level) and the OFF signal level ("L" level) is received at the input terminal 6, and the input signal line 12 inputs it into the circuit 20 to transfer it to the IGBT driving circuit 7. The output end of the inverter 7a in the IGBT driving circuit 7 is connected to a first input end of an NOR circuit 7b. The second output signal line 13 has its one end connected to the node N2 corresponding to the output end of the decision circuit 10 described later, and whose other end is connected to a second input end of the NOR circuit 7b. Further, the output end of the NOR circuit 7b is connected to the input end of a buffer circuit formed of an NPN transistor 7c and a PNP transistor 7d (to the bases of the transistors 7c, 7d), and the output end of the buffer circuit is connected to the gate G of the IGBT 1, or to the node N1, through the gate resistance 8. When the input signal VIN1 rises from the "L" level to the "H" level, the IGBT driving circuit 7 applies a control voltage at the "H" level to the gate G after the ON delay time has elapsed after the timing of its rise. When the input signal VIN1 falls from the "H" level to the "L" level, the driving circuit 7 changes the control voltage to the "L" level after the OFF delay time has elapsed after the timing of its fall.

When the number of stages of the buffer circuit and the like in the driving circuit 7 is increased in correspondence with increase in rated capacity of the motor or the load, the ON delay time and the OFF delay time also increase correspondingly. The number of stages of the buffer circuit etc. in the circuit 7 is usually one or two.

The decision circuit 10 is the main part of the protection circuit 20, whose first input end corresponds to the input end of the gate voltage detecting circuit 5 and whose second input end corresponds to the input end of the current detecting circuit 2. That is to say, the main current input signal line (a second input signal line) 14 carrying the main current of the IGBT 1 has its one end connected to the sense terminal S of the IGBT 1 and its other end connected to the input end of the current detecting circuit 2, and the gate voltage input signal line (a first input signal line) 15 carrying a signal supplying the control voltage has its one end connected to the node N1 and its other end connected to the input end (a first input end) of the gate voltage detecting circuit 5. The output signal line 16 of the current detecting circuit 2 is connected to the input end (a first input end) of the overcurrent detecting circuit 3 and the output signal line 17 of the overcurrent detecting circuit 3 and the output signal line 18 of the gate voltage detecting circuit 5 are connected to the first input end and the second input end of the overcurrent decision circuit 4 formed of an AND circuit, respectively. The first output signal line 19 has its one end connected to the node N2 corresponding to the output end of the overcurrent decision circuit 4, hence of the decision circuit 10, and its other end connected to the error output terminal 9 through an NPN transistor 11. The first output signal line 19 carries an error detection signal (which corresponds to the output signals VO1, VO1A in FIG. 1) providing a decision as to the overcurrent state of the IGBT 1 to output it to the outside. The second output signal line 13 branching from the first output signal line 19 at the output end node N2 transfers the result of decision as to the overcurrent state to the second input end of the NOR circuit 7b as stated above.

Figure 3:
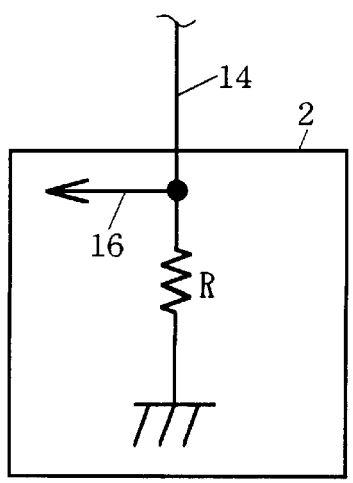
FIG. 3 is a diagram showing an example of structure of the current detecting circuit shown in FIG. 2.

As shown in FIG. 3, the current detecting circuit 2 is formed of a current detecting resistance R having its one end defining its output end and its other end grounded. The value of the resistance R is set to generate as small voltage as possible, just like the circuit shown in FIG. 11, to reduce the power loss at the resistance R.

Figure 4:
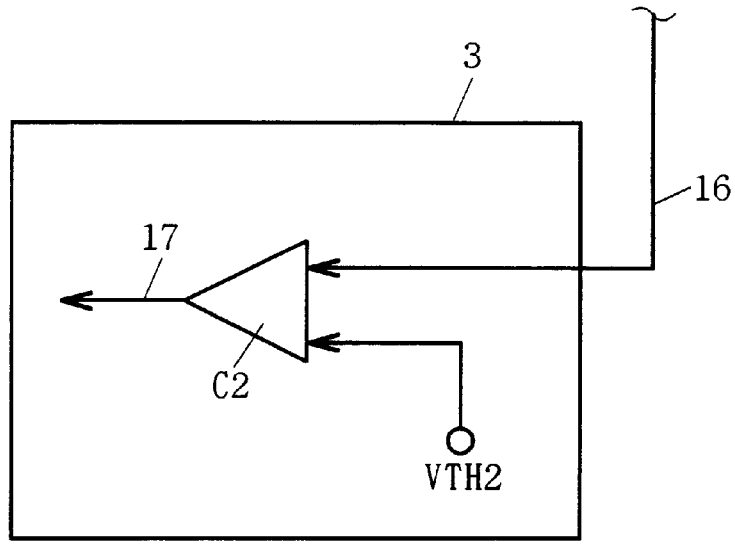
FIG. 4 is a diagram showing an example of structure of the overcurrent detecting circuit shown in FIG. 2.

As shown in FIG. 4, the overcurrent detecting circuit 3 is formed of a second comparator C2 performing a second comparison processing. The comparator C2 has its first input end connected to the output signal line 16, and its second input end is supplied with a second threshold voltage VTH2 (an overcurrent detection level) corresponding to a threshold current as a criterion for determining whether the main current is in the overcurrent state. Accordingly, when the voltage on the output signal line 16 is equal to or larger than the second threshold voltage VTH2, the second comparator C2 provides an output signal at the "H" level to signal occurrence of the overcurrent state (a second comparison). Otherwise, the second comparator C2 only outputs the output signal at the "L" level.

Figure 5:
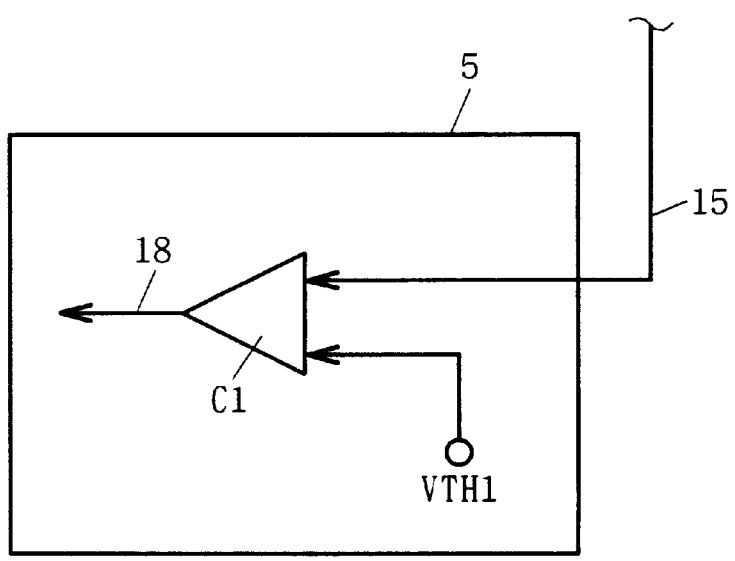
FIG. 5 is a diagram showing an example of structure of the gate voltage detecting circuit shown in FIG. 2.

As shown in FIG. 5, the gate voltage detecting circuit 5 has a first comparator C1 whose first input end receives the signal line 15 as input and whose second input end is supplied with a first threshold voltage VTH1 corresponding to the threshold voltage of the IGBT 1. Only when the voltage on the output signal line 15 is equal to or larger than the first threshold voltage VTH1, this comparator C1 outputs an output signal at the "H" level to indicate that the control voltage to the IGBT 1 is equal to or larger than the threshold voltage of the IGBT 1, that is, that the IGBT 1 is actually in the ON operation state (a first comparison).

The part formed of the circuits 3 to 5 in the decision circuit 10 is depicted as a circuit 10P in the circuits shown in FIG. 9 and FIG. 10 described later as examples of modifications.

Figure 6:
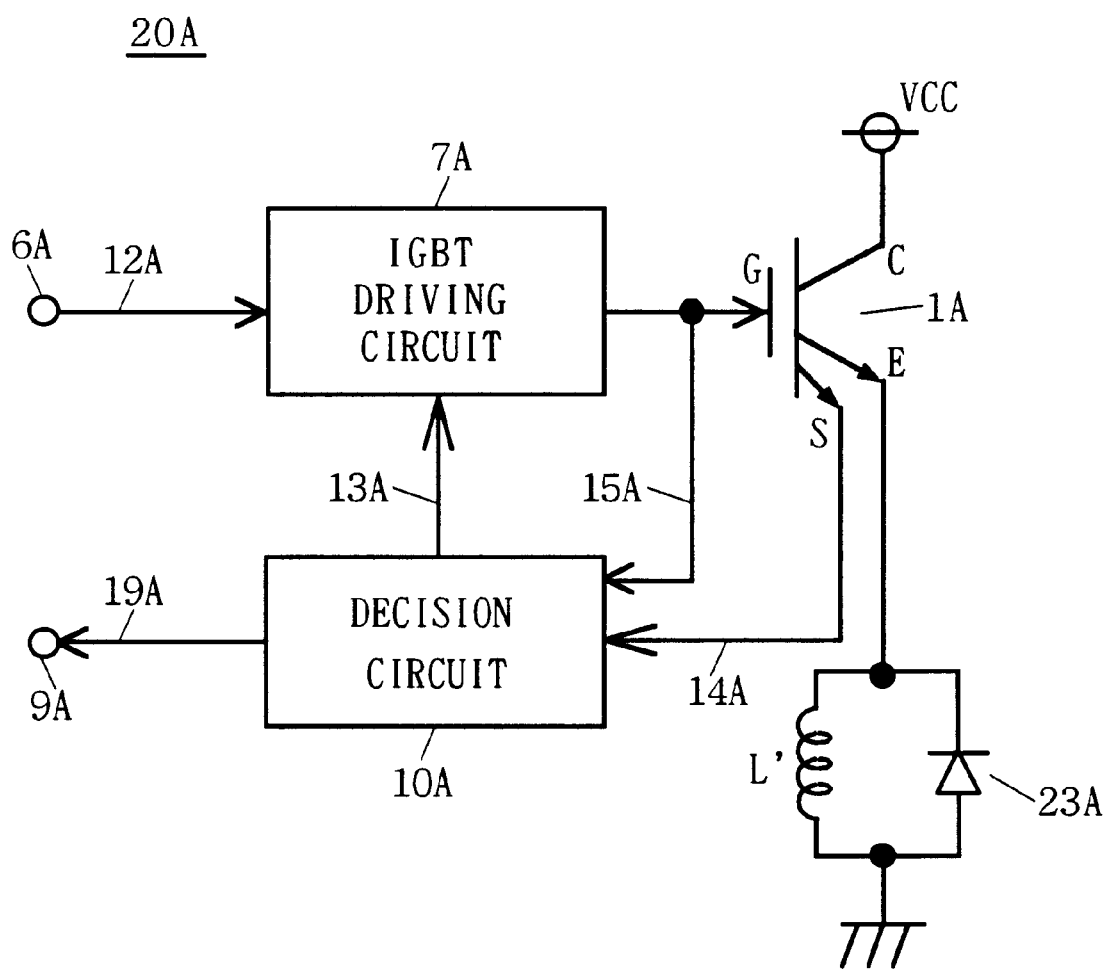
FIG. 6 is a diagram showing another example of the part corresponding to a power transistor overcurrent protection circuit in the circuit shown in FIG. 1.

FIG. 6 is a block diagram showing the protection circuit 20A against overcurrent for the other IGBT 1A connected to the IGBT 1 at the corresponding terminal U, V, or W in each of the inverter circuit portions INVU to INVW in FIG. 1. In the case of the circuit 20A, since the other IGBT 1A forms the high-potential-side switching element relative to the IGBT 1, its emitter terminal or emitter electrode E forms "the first main electrode" connected to the load L', and its collector terminal or collector electrode C corresponds to "the second main electrode." This definition is in the reverse relation to that for the IGBT 1 in FIG. 2. In FIG. 6, the circuits are shown by the same characters as the corresponding circuits in FIG. 2 with "A's" on the right side.

As stated above, since the circuit 20A differs from the circuit 20 in FIG. 2 only in the connection between the load and the IGBT, it provides the same functions and effects as the circuit 20. Hence, operation of the circuit shown in FIG. 2 will now be described.

(A) When overcurrent flows during transition from ON operation to OFF operation:

Operation in this case is shown in the timing chart in FIG. 7A to FIG. 7H.

When the input signal VIN1 at the "H" level corresponding to the ON signal level is applied to the input terminal 6, the control voltage rises to the "H" level after the ON delay time has passed to bring the IGBT 1 into the ON state, and then the main current flows in the IGBT 1. The current detecting circuit 2 monitors the level of the main current.

Now suppose that the input signal VIN1 at the "L" level corresponding to the OFF signal level was applied to the input terminal 6 and then the level of the main current flowing in the IGBT 1 reached the overcurrent detection level at time T1 before the elapse of the OFF delay time OFD required for the IGBT 1 to attain the OFF state. In this case, (1) the overcurrent detecting circuit 3 detects the overcurrent and outputs the output signal at the "H" level. Furthermore, (2) the control voltage applied to the gate G of the IGBT 1 is still larger than the threshold voltage of the IGBT 1 at time T1, so that the gate voltage detecting circuit 5 detects this state and outputs the output signal at the "H" level. As the result, the overcurrent decision circuit 4 provides the output signal at the "H" level, which is inverted in level by the transistor 11 and then sent to the external microcomputer from the error output terminal 9 as the error detection signal indicating occurrence of the overcurrent state. The microcomputer 21 (FIG. 1) is thus informed that the IGBT 1 is in the overcurrent state at a time near the time T1.

Receiving the information, the microcomputer 21 (or the control portion 22) in FIG. 1 outputs the input signals VIN1, VIN1A, VIN2, VIN2A, VIN3, and VIN3A whose levels are fixed at the OFF signal level to the IGBT driving circuit 7 and all of the other power transistor driving circuits to immediately disconnect all of the power transistors into turned-off state, and keeps them disconnected. Note that the power transistor 1 is already in the OFF state at time (T1+t1).

Figure 7:
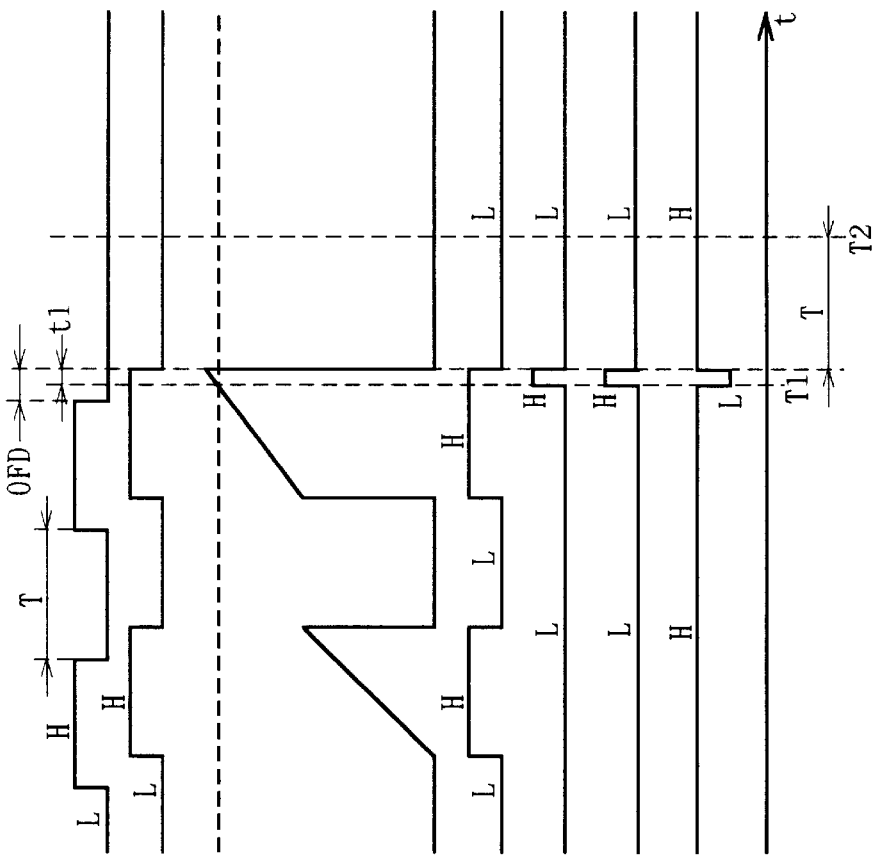
FIG. 7A–FIG. 7H show a timing chart of the overcurrent protection in the use of the overcurrent protection circuit for power transistor according to the first preferred embodiment of the present invention.
Figure 8:
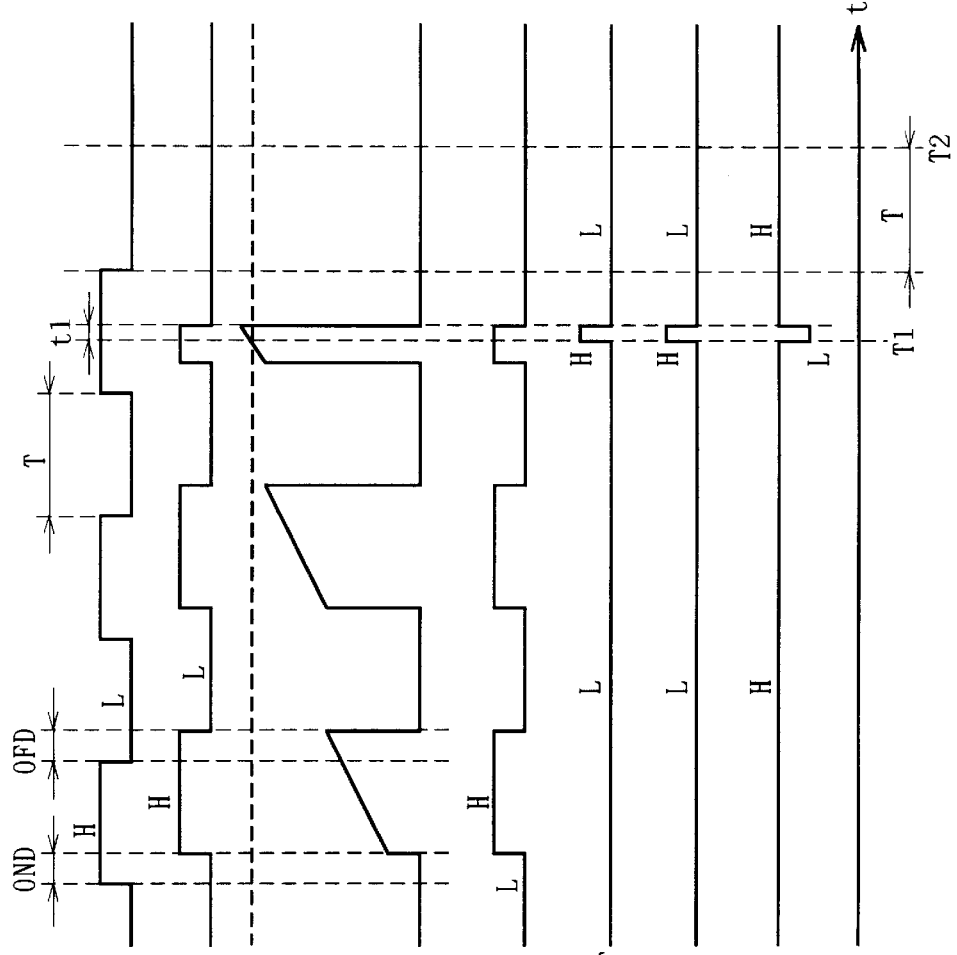
FIG. 8A–FIG. 8H show a timing chart of the overcurrent protection in the use of the overcurrent protection circuit for power transistor according to the first preferred embodiment of the present invention.

In this case, when the overcurrent state is detected and the voltage on the second output signal line 13 changes from the "L" level to the "H" level, the IGBT driving circuit 7 is not affected at all because the output level of the NOR circuit 7b in the IGBT driving circuit 7 is determined at the "L" level by the input signal VIN1 or the output level of the inverter 7a. That is to say, the IGBT 1 goes into the OFF state at the time when the OFF delay time OFD has passed after the input of the input signal VIN1 at the OFF signal level, specifically, at the time when time t1 has passed after time T1. Subsequently, since the control portion 22 which received the error detecting signal VO11 keeps the input signal VIN1 fixed on the "L" level, the main current does not flow. At this time, since the duration time of the pulse of the error detection signal VO1 is short as shown in FIG. 7G, the timer 24 is provided as shown in FIG. 1 to set the duration time of the pulse of the error detection signal VO1 long, as has been already stated, so that the microcomputer 21 can detect it.

Thus, the circuit 20 provides functions and effects which could not be obtained by the background technology. That is to say, when the input signal changes from the ON signal level to the OFF signal level and then the IGBT 1 goes in the overcurrent state before an elapse of the OFF delay time, the circuit 20 can immediately and certainly detect the overcurrent state at the same instant of time as its occurrence. The circuit 20 soon outputs the detected result to the external microcomputer 21 to inform the external microcomputer 21 that an overcurrent state has occurred in the IGBT 1 at timing it earlier after the occurrence of the overcurrent state (this timing precedes the next change of the input signal VIN1 to the ON signal level). This allows the external microcomputer 21 or the control portion 22 to immediately fix the level of the input signal VIN1 at the OFF signal level ("L") to disconnect the IGBT 1 before the input signal VIN1 changes to the ON signal level again so that a main current equal to or larger than the main current flowing in the IGBT 1 at the time (T1+t1) (which is somewhat larger than the overcurrent detection level) will not flow in the IGBT 1. That is to say, it can protect the IGBT 1 from the overcurrent state in an earlier stage and prevent increase in the surge voltage at the time of turn off. Further, the microcomputer 21 can also disconnect other IGBTs used to drive the three-phase motor M with the same timing, thereby certainly disconnecting the other IGBTs in an earlier stage after the occurrence of overcurrent state of the IGBT 1 was detected.

In addition, in this circuit 20, if an output signal at the "H" level takes place on the output signal line 17 due to input of a noise signal with the IGBT 1 in the OFF operation state, the error detection signal VO1 remains at the "H" level since the voltage level on the output signal line 18 remains at the "L" level. That is to say, this circuit also realizes the function of preventing erroneous determination caused by noise in the OFF state as well as the circuit shown in FIG. 11.

(B) When overcurrent state occurs in ON operation:

Operation of the circuit 20 in this case is shown in the timing chart in FIG. 8A to FIG. 8H.

Figure 11:
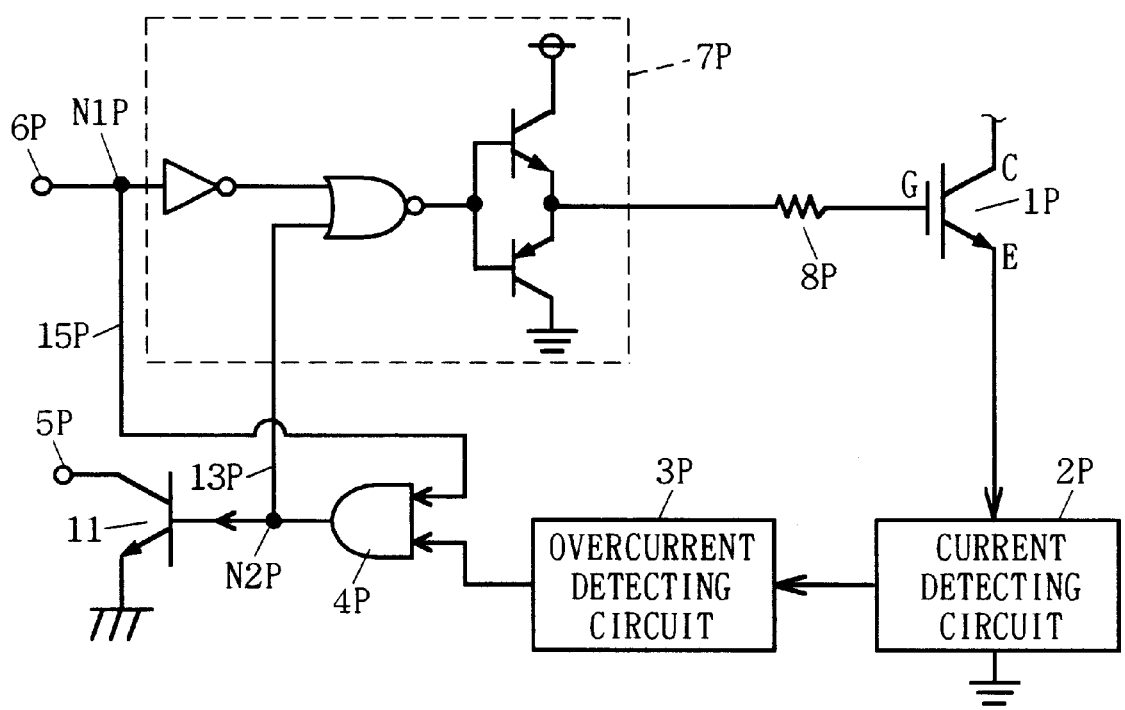
FIG. 11 is a diagram showing a conventional overcurrent protection circuit for a power transistor.

As shown in FIG. 8A to FIG. 8H, this circuit 20 also realizes the same function as the circuit shown in FIG. 11. That is to say, in this case, the decision circuit 10 in FIG. 2 provides not only the function (a) of detecting occurrence of the overcurrent state at the moment of time T1 at which the increasing main current for the IGBT 1 reaches the overcurrent detection level while the IGBT 1 is in the ON state and outputting the determined result to outside as the error detection signal VO1, but also the function (b) of causing the signal on the second output signal line 13 to rise to the "H"

level and inputting it to the NOR circuit 7b in the IGBT driving circuit 7 so that the IGBT 1 in the ON operation itself is forced into the OFF operation to interrupt the overcurrent after an elapse of the delay time t1 at which the main current has increased only slightly over the overcurrent detection level, thereby protecting the IGBT 1 at earlier timing.

Then the microcomputer 21 (or the control portion 22) fixes the level of the input signal VIN1 at the "L" level in response to the error detection signal VO11 (FIG. 1) between time T1 and time T2 at which the input signal VIN1 will rise again. This keeps the IGBT 1 disconnected after time T2. The microcomputer 21 also sets the levels of all the input signals for the other IGBTs at the "L" level at the same timing, and the other IGBTs are kept disconnected after time T2 as well.

This way, this circuit 20 also has all the functions realized by the background art.

The decision circuit 10 of the present invention can be defined as follows with the operations described in the sections (A) and (B) and the circuit configurations shown in FIG. 1 and FIG. 6. That is to say, the decision circuit 10 receives the main current and the control voltage of the power transistor as its input signals, and when it detects that (i) the control voltage is equal to or larger than the threshold voltage of the power transistor (the first comparison) and that (ii) the main current is equal to or larger than a certain threshold current (the overcurrent detection level, the second comparison) (AND), it determines that the power transistor is in the overcurrent state and outputs the determination to an external control system (21, 22) through the output signal line 19 as the error detection signal. The output end of the decision circuit 10 is also connected to the IGBT driving circuit 9, and it also has the function of, when it detects occurrence of the overcurrent state of the IGBT 1 when the level of the input signal VIN1 is at the ON signal level ("H"), controlling the IGBT driving circuit 7 to change the control voltage at or over the threshold voltage of the IGBT 1 to a voltage under the threshold voltage.

As described so far, the overcurrent protection circuit for power transistor according to the preferred embodiment performs the operation of determining that the power transistor is in the overcurrent state when (1) the control voltage of the power transistor is equal to or larger than the threshold voltage of the power transistor and (2) the overcurrent detector detects the overcurrent state (i.e., at the time when both the conditions (1) and (2) are satisfied) and signaling the determination to the outside. This allows the microcomputer to fix the levels of the input signals VIN1 to VIN3A (FIG. 1) at the OFF signal level at timing as close to the moment of the overcurrent state occurrence as possible to force that power transistor and all of the other power transistors for driving the motor to turn off, so that the power transistors can be disconnected while the main current flowing is smaller than in conventional devices, which remarkably decreases the surge voltage at the time of turn off as compared with conventional devices.

(First Example of Modification)

Although the IGBT 1 in the first preferred embodiment has the sense terminal S as shown in FIG. 1, FIG. 2 and FIG. 6, the power transistor in the semiconductor circuit according to the present invention is not limited to such a sense-equipped IGBT. For example, an overcurrent protection circuit for power transistor can be constructed similarly to that shown in FIG. 2 by using an IGBT having no sense terminal as the power transistor.

Figure 9:
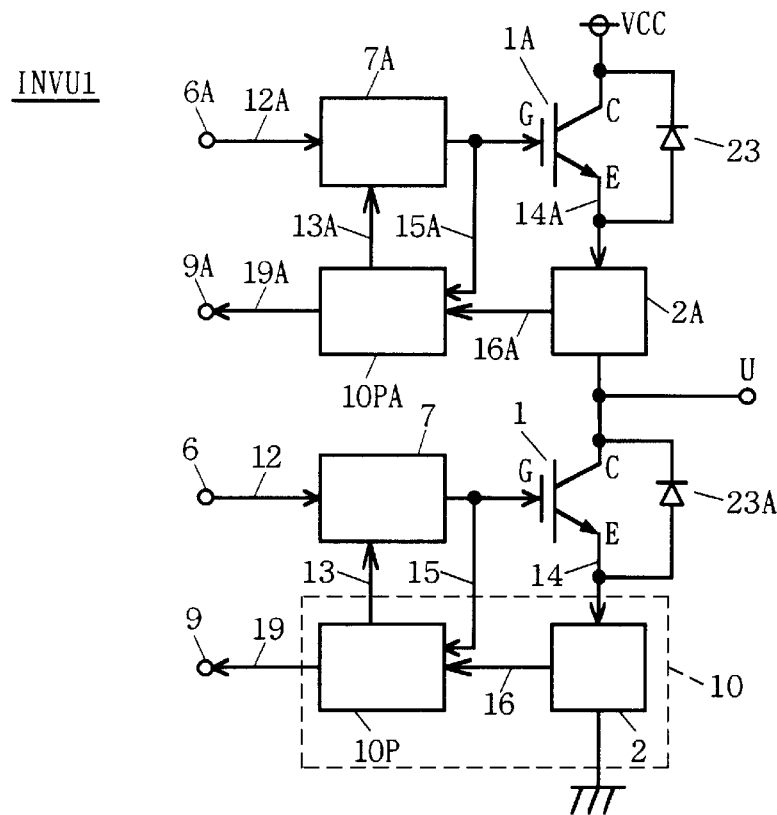
FIG. 9 is a diagram showing a first example of modification of the first preferred embodiment.

FIG. 9 shows an example thereof. FIG. 9 shows, for convenience, a modification of the first inverter circuit portion INVU shown in FIG. 1, but the structure of the circuit INVU1 shown in FIG. 9 can be applied also to the second and third inverter circuit portions INVV, INVW shown in FIG. 1 in the same way.

Needless to say, this modification provides the functions and effects described in the first preferred embodiment as well.

(Second Example of Modification)

Figure 10:
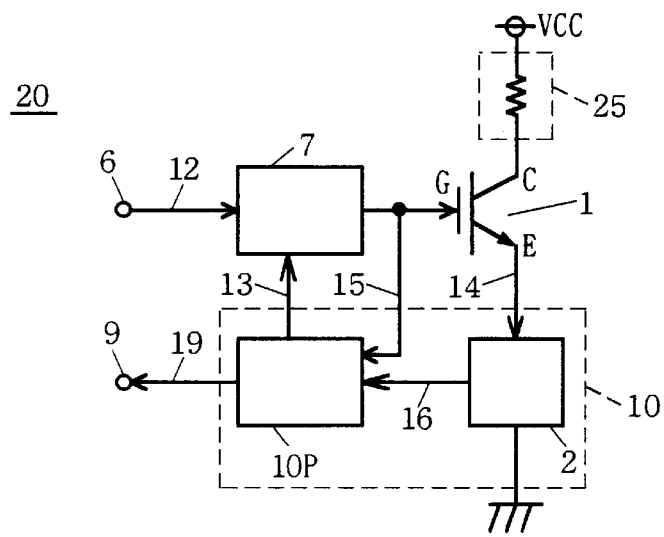
FIG. 10 is a diagram showing a second example of modification of the first preferred embodiment.

Although the load is the inductance L determined on the basis of the coils LU to LW of the motor M shown in FIG. 1 in the first preferred embodiment and the first example of modification, the load may be a resistance 25 as shown in FIG. 10, for example. When the load is the resistance 25, the main current flowing in the resistance 25 simply increases when the IGBT 1 is ON and no main current flows in the IGBT 1 when it is OFF. Accordingly, when the IGBT 1 becomes ON again, the main current does not cumulatively increase like in the case of the load of inductance. However, in this case, as well, an overcurrent may flow not only when the IGBT 1 is ON but also when it is making a transition from ON to OFF because of the effect of noise signal or variation in external voltage. Hence, applications of the semiconductor circuit of the present invention provide the same functions and effects as those described in the first preferred embodiment also when the load is resistance, thus providing a useful overcurrent protection circuit for power transistor.

The circuit shown in FIG. 10 corresponds to that shown in FIG. 2, where the same reference characters denote the same components.

(Third Example of Modification)

The power transistors are not limited to the IGBTs, but insulated-gate switching devices such as power MOSFETs can be used as the power transistors, for example.

(Fourth Example of Modification)

Although the microcomputer 21 outputs separate input signals to the inverter portions INVU to INVW in the example shown in FIG. 1, all of the input signals to the inverter portions may be the same input signals (in which case the input signal VIN1 and the other input signals VIN1A to VIN3A are the same signals), or input signals to only a plurality of inverter portions may be the same input signals with the other input signals separately set. In this sense, "the other input signals" are defined as a concept including the cases where they are the same signals as the "input signals."

While the invention has been described in detail, the foregoing description is in all aspects illustrative and not restrictive. It is understood that numerous other modifications and variations can be devised without departing from the scope of the invention.

I claim:

1. A semiconductor circuit comprising:
   a power transistor comprising a first main electrode connected to a load, a second main electrode, and a control electrode, said power transistor passing a main current between said first main electrode and said second main electrode when a control voltage applied to said control electrode is equal to or larger than a threshold voltage;
   an output signal line receiving and transmitting an input signal having an ON signal level and an OFF signal level which alternately and periodically vary;
   a driving circuit comprising an input end connected to said input signal line and an output end connected to said control electrode of said power transistor, said driving circuit outputting said control voltage equal to or larger than said threshold voltage from said output end after a delay corresponding to an ON delay time has passed after input of said input signal when the level of said input signal is at said ON signal level, and outputting said control voltage smaller than said threshold voltage from said output end after a delay corresponding to an OFF delay time has passed after input of said input signal when said level of said input signal is at said OFF signal level; and a decision circuit connected to said power transistor to receive said main current as a first input signal and connected to said control electrode of said power transistor to receive said control voltage of said power transistor as a second input signal, said decision circuit determining that said power transistor is in an overcurrent state when detecting that said control voltage is equal to or larger than said threshold voltage and said main current is equal to or larger than a certain threshold current.

2. The semiconductor circuit according to claim 1, wherein said decision circuit executes a first comparison between said control voltage and said threshold voltage and a second comparison between said main current and said threshold current and decides whether said overcurrent state is occurring on the basis of a result of said first comparison and a result of said second comparison.

3. The semiconductor circuit according to claim 2, further comprising:

an output signal line connected to an output end of said decision circuit, outputting an output signal presenting the result of the decision made by said decision circuit as an error detection signal.

4. The semiconductor circuit according to claim 3, further comprising a control circuit connected to said input signal line and said output signal line, said control circuit fixing the level of said input signal at said OFF signal level in response to input timing of said error detection signal when said error detection signal indicates that said power transistor is in said overcurrent state.

5. The semiconductor circuit according to claim 4, further comprising:

another power transistor driving an external load device together with said power transistor, and another driving circuit comprising an input end connected to said control circuit and receiving another input signal outputted from said control circuit and alternately varied between said ON signal level and said OFF signal level, to thereby driving said another power transistor, wherein when said error detection signal indicates that said power transistor is in said overcurrent state, said control circuit fixes the level of said another input signal at said OFF signal level in response to input timing of said error detection signal.

6. The semiconductor circuit according to claim 5, wherein said driving circuit is connected also to said output end of said decision circuit, and said driving circuit changes said control voltage equal to or larger than said threshold voltage to said voltage smaller than said threshold voltage when said level of said input signal is at said ON signal level and the result of said decision made by said decision circuit shows detection of said overcurrent state.

7. The semiconductor circuit according to claim 1, wherein said driving circuit is connected also to said output end of said decision circuit, and said driving circuit chances said control voltage equal to or larger than said threshold voltage to said voltage smaller than said threshold voltage when said level of said input signal is at said ON signal level and the result of said decision made by said decision circuit shows detection of said overcurrent state.

* * * * *